(12) United States Patent
Noguchi et al.

(10) Patent No.: US 7,266,152 B2
(45) Date of Patent: Sep. 4, 2007

(54) DIGITAL SIGNAL PROCESSING DEVICE AND DIGITAL SIGNAL PROCESSING METHOD

(75) Inventors: Masayoshi Noguchi, Chiba (JP); Gen Ichimura, Tokyo (JP); Nobukazu Suzuki, Kanagawa (JP)

(73) Assignee: Sony Corporation (JP)

( * ) Notice: Subject to any disclaimer, the term of this patent is extended or adjusted under 35 U.S.C. 154(b) by 759 days.

(21) Appl. No.: 10/629,418

(22) Filed: Jul. 29, 2003

(65) Prior Publication Data

US 2004/0052310 A1 Mar. 18, 2004

(30) Foreign Application Priority Data

Aug. 20, 2002 (JP) ............................ P2002-239730
Jul. 8, 2003 (JP) ............................ P2003-193821

(51) Int. Cl.
*H04B 14/06* (2006.01)
(52) U.S. Cl. ...................... 375/247; 375/243; 375/244; 375/245; 375/246; 341/77; 341/126; 341/143
(58) Field of Classification Search ................. 375/247, 375/245, 243, 244, 246; 341/126, 143, 77
See application file for complete search history.

(56) References Cited

U.S. PATENT DOCUMENTS

| 5,859,603 | A   | * | 1/1999  | Noguchi et al. ............... 341/77  |
| 6,326,912 | B1  | * | 12/2001 | Fujimori ...................... 341/143 |
| 6,518,899 | B2  | * | 2/2003  | Yu .............................. 341/118 |
| 2002/0186440 | A1 | * | 12/2002 | Adachi et al. ............... 359/181 |
| 2004/0081266 | A1 | * | 4/2004  | Adachi et al. .............. 375/376 |

* cited by examiner

*Primary Examiner*—Chieh M. Fan
*Assistant Examiner*—Julia P. Tu
(74) *Attorney, Agent, or Firm*—Lerner, David, Littenberg, Krumholz & Mentlik, LLP

(57) ABSTRACT

A device for performing predetermined processing on an input signal that may have a signal amplitude of more than one bit. The input signal is obtained by subjecting one-bit serial signals to predetermined signal processing, wherein the signal amplitude of more than one bit is converted to a one-bit serial signal by accumulating the signal amplitudes that exceed one bit, delaying the accumulated signal on the basis of the input signal, and outputting the accumulated signal.

9 Claims, 10 Drawing Sheets

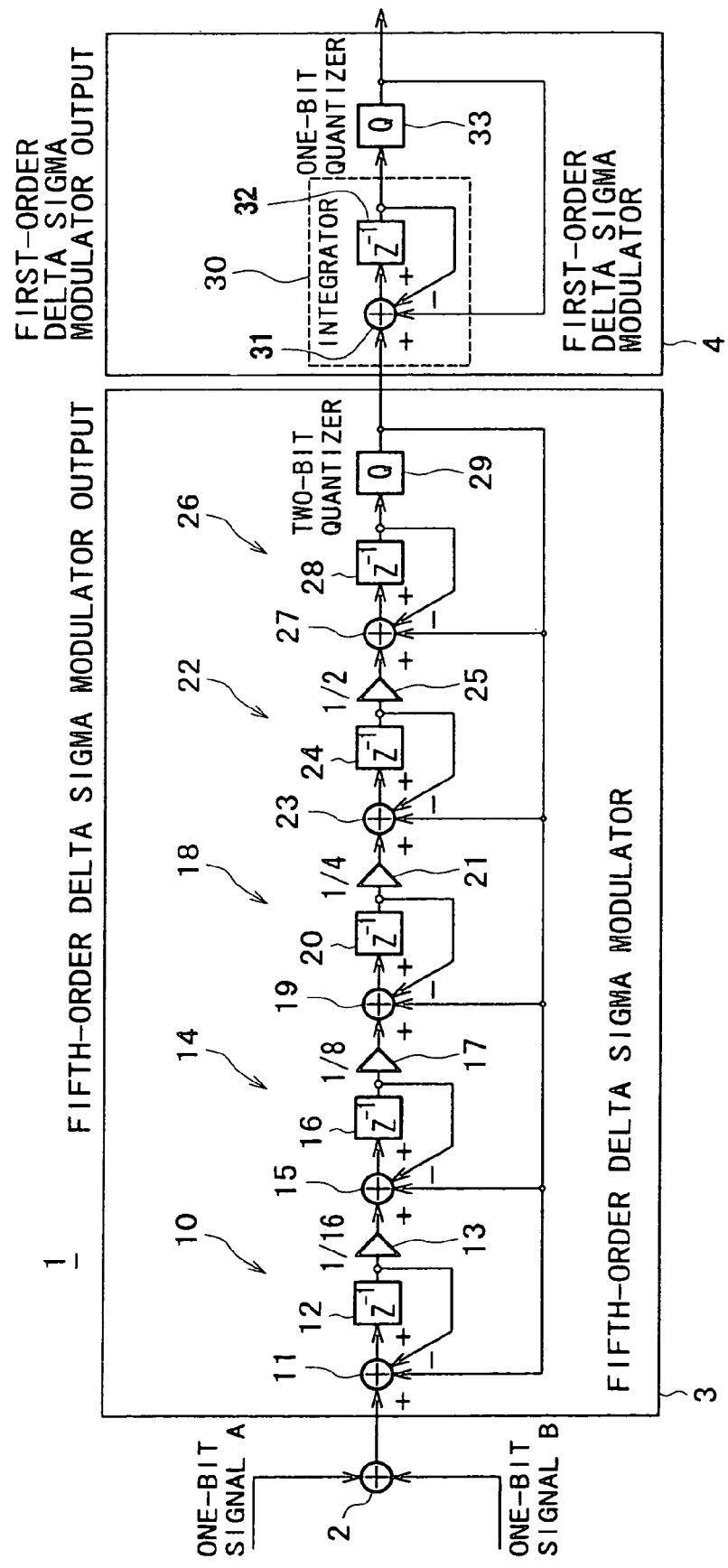

TWO-BIT QUANTIZED VALUE

ONE-BIT QUANTIZED VALUE

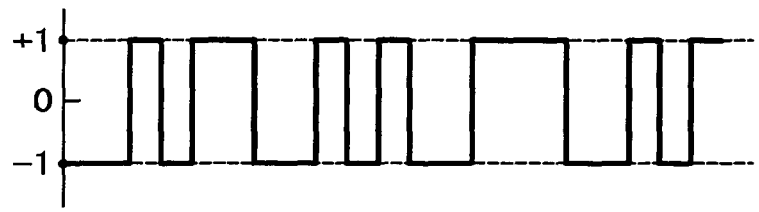
F I G. 8 A
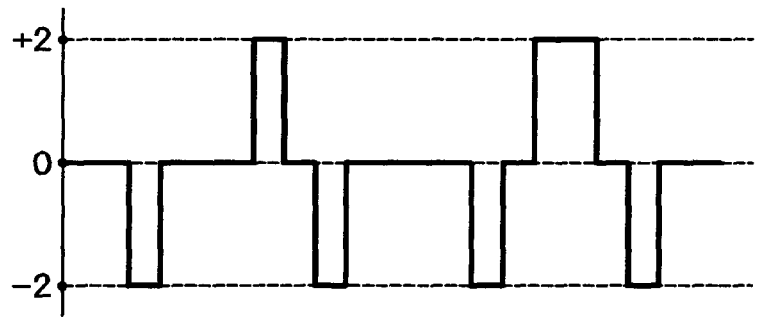
F I G. 8 B
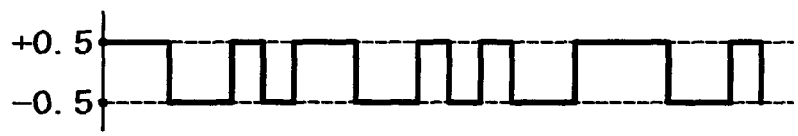
F I G. 8 C
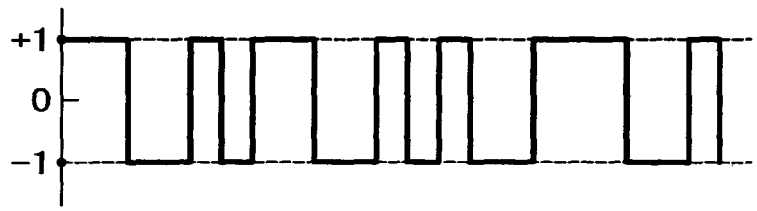
F I G. 8 D

DIGITAL SIGNAL PROCESSING DEVICE AND DIGITAL SIGNAL PROCESSING METHOD

BACKGROUND OF THE INVENTION

The present invention relates to processing for representing amplitude of an output signal by one bit when a digitally processed signal of signal amplitude exceeding one bit as a result of predetermined signal processing on a digital signal represented by one bit is inputted and predetermined delta sigma modulation processing is performed on the digitally processed signal inputted.

A data format used for conventional digital audio has a sampling frequency of 44.1 kHz and a data word length of 16 bits, for example. In contrast, a high-speed one-bit audio signal resulting from delta sigma modulation has a very high sampling frequency of 64 times 44.1 kHz and a short data word length of one bit, for example. The high-speed one-bit audio signal resulting from delta sigma modulation thus features a broad transmittable frequency band as compared with the data format used for conventional digital audio. In addition, even with the one-bit signal, the delta sigma modulation enables a high dynamic range to be secured in an audio band of low frequencies as compared with the oversampling frequency of 64 times the sampling frequency. These features can be utilized to apply the high-speed one-bit audio signal to recorders and data transmission maintaining high sound quality.

The delta sigma modulation itself is not a particularly new technique. A delta sigma modulating circuit has conventionally been used often within an AD converter or the like because circuit configuration of the delta sigma modulating circuit is suitable for IC integration and accuracy of AD conversion can be secured relatively easily.

By passing the delta sigma modulated signal through a simple analog low-pass filter, an analog audio signal can be extracted.

In mixing delta sigma modulated one-bit signals of a plurality of channels, results of calculation of the plurality of channels obtained by multiplying the respective one-bit signals by respective predetermined mixing ratios are added together and then subjected to delta sigma modulation again to thereby generate a new one-bit signal. At this time, when the mixed signals are signals of highly correlated channels, an audio band component signal resulting from addition of the results of calculation of the plurality of channels obtained by multiplying the respective one-bit signals by the respective predetermined mixing ratios is increased in level. A delta sigma modulator capable of modulating a high signal level is therefore required.

However, in order to suppress an increase in quantization noise level due to remodulation, a delta sigma modulator of high order such for example as fifth order is used as a delta sigma modulator for performing the remodulation. In this case, a maximum percentage modulation of about 50% is normally used. For system stability, a high percentage modulation exceeding 50%, for example, cannot be obtained in a high-order delta sigma modulator.

On the other hand, a first-order delta sigma modulator can perform modulation up to 100% modulation. However, the first-order delta sigma modulator cannot be used because quantization noise level in an audio band is increased.

Thus, in order to mix signals without limit processing, there is no choice but to lower the signal level of each channel and limit the percentage modulation at the time of the delta sigma remodulation. As a result, the quantization noise level is increased relative to the lowered signal level, thus lowering S/N ratio of an audible band.

In addition, in a digital signal processing device formed with requantizing means for requantizing multi-bit data outputted by quantizing means, the provision of each of the quantizing means increases circuit scale.

SUMMARY OF THE INVENTION

According to the present invention, there is provided a digital signal processing device to which after digital signals are subjected to predetermined processing, a processed digital signal having signal amplitude values exceeding signal amplitude values of the digital signals is inputted, the digital signal processing device including: first delta sigma modulating means including first quantizing means having quantized amplitude values allowing at least quantization of signal amplitude of the inputted processed digital signal; and second delta sigma modulating means including second quantizing means having quantized amplitude values equal to the signal amplitude values of the digital signals for quantizing a modulated signal outputted from the first delta sigma modulating means.

Further, according to the present invention, there is provided a digital signal processing method in which digital signals are subjected to predetermined processing, and a processed digital signal having signal amplitude values exceeding signal amplitude values of the digital signals is inputted, the digital signal processing method including: a step for subjecting the inputted processed digital signal to delta sigma modulation, and quantizing amplitude of the delta sigma modulated signal with at least quantized values not less than the amplitude values of the processed digital signal; and a step for quantizing the quantized modulated signal into quantized amplitude values equal to the signal amplitude values of the digital signals.

Further, according to the present invention, there is provided a digital signal processing device to which after digital signals represented by one bit are subjected to predetermined signal processing, a digital signal processed signal having signal level exceeding the one bit is inputted, the digital signal processing device including: first quantizing means for outputting two values having zero interposed between the two values and separated from the two values by equal quantities and values having a difference equal to a difference between the two values as a first group of quantized values each including n bits (n is 2 or more); and second quantizing means for outputting values equal to two least significant quantized values of the first group of quantized values outputted by the first quantizing means as a second group of quantized values; wherein the second quantizing means averages energy of the first group of quantized values outputted by the first quantizing means and outputs the second group of quantized values.

BRIEF DESCRIPTION OF THE DRAWINGS

These and other objects of the invention will be seen by reference to the description, taken in connection with the accompanying drawing, in which:

FIG. 1 is a diagram of configuration of a digital signal processing device according to a first embodiment;

FIGS. 8A, 8B, 8C, and 8D are timing charts of assistance in explaining operation when the second-order delta sigma modulator is used;

DETAILED DESCRIPTION OF PREFERRED EMBODIMENTS

Figure 2A:
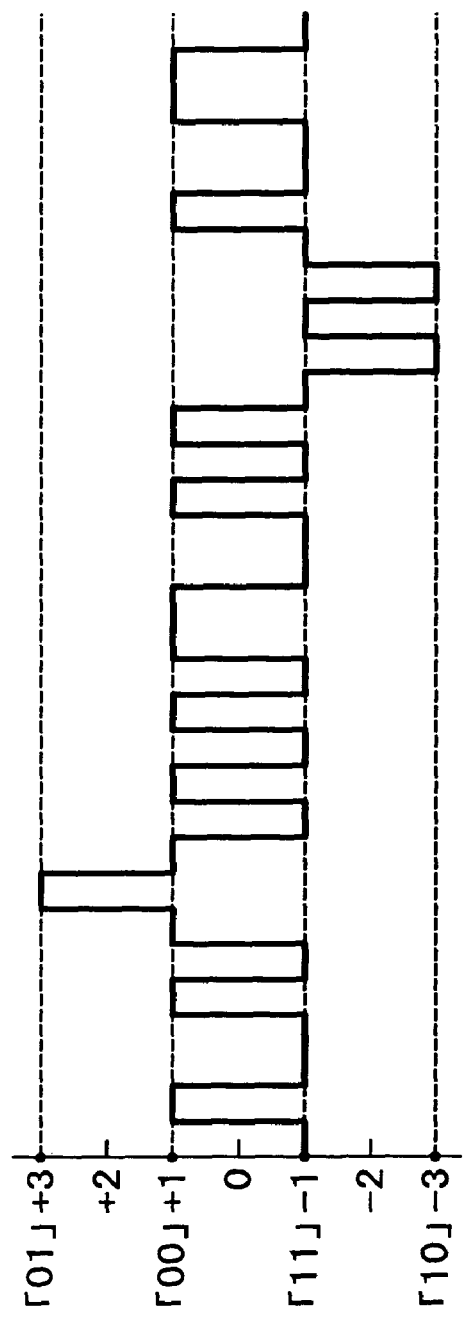
FIGS. 2A and 2B are timing charts of assistance in explaining operation of the first embodiment.

A few embodiments of a digital signal processing device and a digital signal processing method according to the present invention will hereinafter be described with reference to the drawings.

A first embodiment will first be described with reference to FIGS. 1 to 3C. As shown in FIG. 1, the first embodiment is a digital signal processing device 1 for converting an output obtained by adding together a one-bit signal A and a one-bit signal B each obtained by delta sigma modulation processing into a one-bit signal using two cascaded delta sigma modulators 3 and 4, and deriving the output of the one-bit signal.

When the one-bit signal A and the one-bit signal B are signals of highly correlated channels, the addition output of an adder 2 may exceed a maximum audio band level representable by a delta sigma modulated one-bit signal. The digital signal processing device 1 converts the high-level signal exceeding the maximum audio band level into a one-bit signal.

In order to convert an input signal that may exceed the maximum audio band level representable by a one-bit signal into a one-bit signal, the digital signal processing device 1 comprises a fifth-order delta sigma modulator 3 as first delta sigma modulating means and a first-order delta sigma modulator 4 as second delta sigma modulating means. The fifth-order delta sigma modulator 3 has a two-bit quantizer 29 as first quantizing means for quantizing an input signal into two bits representable by four values. The first-order delta sigma modulator 4 has a one-bit quantizer 33 as second quantizing means for quantizing a delta sigma modulator output outputted in two bits from the fifth-order delta sigma modulator 3 into one bit.

The fifth-order delta sigma modulator 3 is formed with a first integrator 10, a second integrator 14, a third integrator 18, a fourth integrator 22, and a fifth integrator 26. The delta sigma modulator 3 further includes: a first coefficient multiplier 13 for attenuating an integration output of the first integrator 10 by multiplying the integration output of the first integrator 10 by a first coefficient; a second coefficient multiplier 17 for attenuating an integration output of the second integrator 14 by multiplying the integration output of the second integrator 14 by a second coefficient; a third coefficient multiplier 21 for attenuating an integration output of the third integrator 18 by multiplying the integration output of the third integrator 18 by a third coefficient; and a fourth coefficient multiplier 25 for attenuating an integration output of the fourth integrator 22 by multiplying the integration output of the fourth integrator 22 by a fourth coefficient. The delta sigma modulator 3 further includes the two-bit quantizer 29 for quantizing an integration output of the fifth integrator 26 as the last integrator.

The first integrator 10 comprises an adder 11 and a shift computing element 12. The second integrator 14 comprises an adder 15 and a shift computing element 16. The third integrator 18 comprises an adder 19 and a shift computing element 20. The fourth integrator 22 comprises an adder 23 and a shift computing element 24. The fifth integrator 26 comprises an adder 27 and a shift computing element 28.

When the addition output of the adder 2 enters the delta sigma modulator 3, the first integrator 10 supplies the addition output to the shift computing element 12 via the adder 11. The shift computing element 12 shifts the addition output from the adder 11, and returns the addition output to the adder 11. Also, a feedback loop signal is negatively fed back from the two-bit quantizer 29 to the adder 11. An integration output of the first integrator 10 is supplied to the first coefficient multiplier 13. The first coefficient multiplier 13 attenuates the integration output of the first integrator 10 by multiplying the output by $1/16$ as the first coefficient, and then supplies the multiplied output to the second integrator 14.

The second integrator 14 supplies the multiplied output from the first coefficient multiplier 13 to the shift computing element 16 via the adder 15. The shift computing element 16 shifts an addition output from the adder 15, and returns the addition output to the adder 15. Also, a feedback loop signal is negatively fed back from the two-bit quantizer 29 to the adder 15. An integration output of the second integrator 14 is supplied to the second coefficient multiplier 17. The second coefficient multiplier 17 attenuates the integration output of the second integrator 14 by multiplying the output by $1/8$ as the second coefficient, and then supplies the multiplied output to the third integrator 18.

The third integrator 18 supplies the multiplied output from the second coefficient multiplier 17 to the shift computing element 20 via the adder 19. The shift computing element 20 shifts an addition output from the adder 19, and returns the addition output to the adder 19. Also, a feedback loop signal is negatively fed back from the two-bit quantizer 29 to the adder 19. An integration output of the third integrator 18 is supplied to the third coefficient multiplier 21. The third coefficient multiplier 21 attenuates the integration output of the third integrator 18 by multiplying the output by $1/4$ as the third coefficient, and then supplies the multiplied output to the fourth integrator 22.

The fourth integrator 22 supplies the multiplied output from the third coefficient multiplier 21 to the shift computing element 24 via the adder 23. The shift computing element 24 shifts an addition output from the adder 23, and returns the addition output to the adder 23. Also, a feedback loop signal is negatively fed back from the two-bit quantizer 29 to the adder 23. An integration output of the fourth integrator 22 is supplied to the fourth coefficient multiplier 25. The fourth coefficient multiplier 25 attenuates the integration output of the fourth integrator 22 by multiplying the output by $1/2$ as the fourth coefficient, and then supplies the multiplied output to the fifth integrator 26.

The fifth integrator 26 supplies the multiplied output from the fourth coefficient multiplier 25 to the shift computing element 28 via the adder 27. The shift computing element 28 shifts an addition output from the adder 27, and returns the addition output to the adder 27. Also, a feedback loop signal is negatively fed back from the two-bit quantizer 29 to the adder 27. An integration output of the fifth integrator 26 is supplied to the two-bit quantizer 29.

The two-bit quantizer 29 quantizes the integration output of the fifth integrator 26 to output a two-bit signal. The quantized values each formed of two bits are for example two values ±1 having zero interposed between the two values and separated from the two values by equal quantities, and values ±3 having differences equal to a difference (2) between the two values ±1 between the values ±3 and the values ±1. In other words, zero is not used for the four quantized values each formed of two bits, but quantized values ±1 at the time of one-bit quantization and ±3 having the difference between the two values ±1 to be separated at equal intervals from ±1 are used. That is, the quantized values are +3, +1, −1, and −3 at equal intervals of the difference of 2. The two-bit signal is negatively fed back as a feedback loop signal to each integrator. The two-bit quantizer 29 also outputs the output of the two-bit signal as a fifth-order delta sigma modulator output to the outside of the fifth-order delta sigma modulator 3.

A configuration of the first-order delta sigma modulator 4 for converting the fifth-order delta sigma modulator output to a first-order delta sigma modulator output will next be described. The first-order delta sigma modulator 4 comprises one integrator 30 and a one-bit quantizer 33.

The integrator 30 comprises an adder 31 and a shift computing element 32. When the fifth-order delta sigma modulator output enters the first-order delta sigma modulator 4, the integrator 30 supplies the fifth-order delta sigma modulator output to the shift computing element 32 via the adder 31. The shift computing element 32 shifts the fifth-order delta sigma modulator output from the adder 31, and returns the fifth-order delta sigma modulator output to the adder 31. Also, a feedback loop signal is negatively fed back from the one-bit quantizer 33 to the adder 31. In the first embodiment, the shift computing element 32 produces a delay of one period in sampling periods to be described later.

The one-bit quantizer 33 quantizes the output of the shift computing element 32 into two one-bit values. When a positive value is inputted from the shift computing element 32, the one-bit quantizer 33 outputs +1 as a quantized value. When a negative value is inputted from the shift computing element 32, on the other hand, the one-bit quantizer 33 outputs −1 as a quantized value. In the first embodiment, a binary code 1 actually outputted from the one-bit quantizer corresponds to the quantized value +1, whereas a binary code 0 corresponds to the quantized value −1. The two one-bit values from the one-bit quantizer 33 are negatively fed back as a feedback loop signal to the integrator, and also outputted to the outside as a first-order delta sigma modulator output. Incidentally, a signal delay before the one-bit quantizer 33 quantizes a signal inputted thereto is shorter than one sampling period to be described later.

Principles of operation of the digital signal processing device 1 having the configuration shown above will be described in the following with reference to FIG. 2A and FIG. 2B.

One-bit signals A and B from two systems are subjected to addition processing by the adder 2, and thereafter subjected to delta sigma modulation again by the fifth-order delta sigma modulator 3 to reduce degradation in sound quality.

When the one-bit signals A and B from the two systems are identical signals, the audio band component after the signals are subjected to addition processing by the adder 2 is increased to twice that of a one-bit signal from one system.

When an input signal level is increased and percentage modulation becomes higher, however, the system of a delta sigma modulator of a high order such for example as a fifth order becomes unstable. This is because in a case where the quantized values are two values ±1, that is, in a case where a one-bit quantizer is used, when the audio band component approaches ±1, it is difficult to represent the audio band component by levels of the two values ±1.

In the present invention, to enable modulation of such a high-level signal, the number of quantization bits of the quantizer 29 is increased to two, and the fifth-order delta sigma modulator 3 using four quantized values is used to generate a delta sigma modulated signal representing an audio band signal that temporarily exceeds ±1.

As described above, for the four quantized values, zero is not used but quantized values ±1 at the time of one-bit quantization and ±3 having the difference between the two values ±1 to be separated at equal intervals from ±1 are used. Thereby, as shown in FIG. 2A, the four quantized values form a first group of quantized values +3, +1, −1, and −3 at equal intervals of the difference of 2. As shown in FIG. 2B, the signal temporarily converted into a two-bit signal is reconverted into a one-bit signal by the first-order delta sigma modulator 4 in a subsequent stage.

Figure 2B:
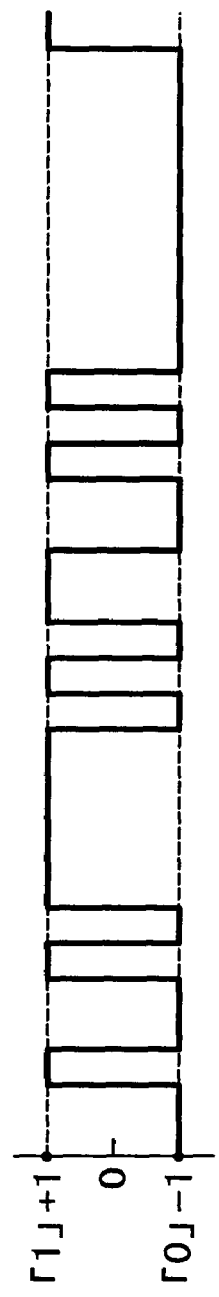

In this case, as shown in FIG. 2B, quantized values of the one-bit quantizer 33 in the subsequent stage are a second group of quantized values ±1. Hence, while the audio band component is small and the quantized values in the preceding stage do not exceed the two values ±1, the output values in the preceding stage are outputted as they are only with a delay of one sample occurring in the first-order delta sigma modulator 4 in the subsequent stage. That is, characteristics of the fifth-order delta sigma modulation are outputted as they are. When the audio band component becomes large and the fifth-order delta sigma modulator 3 in the preceding stage outputs ±3, on the other hand, the first-order delta sigma modulator 4 in the subsequent stage corrects an amount by which ±3 exceed ±1 after delaying the processing until a time when the amount can be corrected, and thereafter outputs values in the preceding stage as they are. When +3 is outputted from the fifth-order delta sigma modulator 3 in the preceding stage, for example, the first-order delta sigma modulator 4 in the succeeding stage outputs +1, and stores a difference of 2 in the integrator 30. Then, when −1 comes next, the first-order delta sigma modulator 4 corrects −1 to +1, and outputs +1. Thereby the difference of 2 stored in the integrator 30 is cleared. Thereafter the first-order delta sigma modulator 4 delays and outputs output of ±1 in the preceding stage as it is again. Thus, processing for conversion from two bits to one bit is performed only when amplitude of the audio band component becomes high and exceeds ±1, and the processing does not produce effects at other times.

While a delta sigma modulator normally modulates a signal within a range of quantized values, the quantizer 33 within the first-order delta sigma modulator 4 in the succeeding stage in this case functions to correct an amount of excess when a quantized value within the delta sigma modulator 3 exceeds ±1.

This is equivalent to averaging energy by converting multi-bit code to one bit in the first-order delta sigma modulator 4.

The conversion of multi-bit code to one bit which conversion is equivalent to the averaging of energy will be described in the following with reference to FIG. 3A, FIG. 3B, and FIG. 3C.

As described above, when an audio band component becomes large and the fifth-order delta sigma modulator in the preceding stage outputs ±3, the first-order delta sigma modulator in the subsequent stage corrects an amount by which ±3 exceed ±1 after delaying the processing until a time when the amount can be corrected, and thereafter outputs values in the preceding stage as they are again.

Figure 3A:
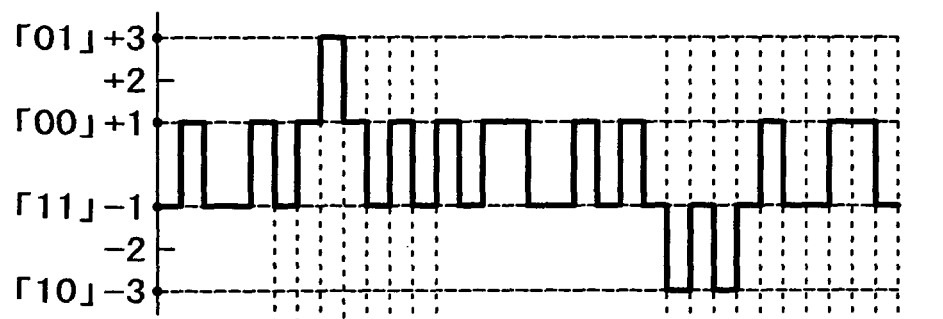
FIGS. 3A, 3B, and 3C are timing charts of assistance in explaining the averaging of energy in a second delta sigma modulator forming the first embodiment.
Figure 3B:
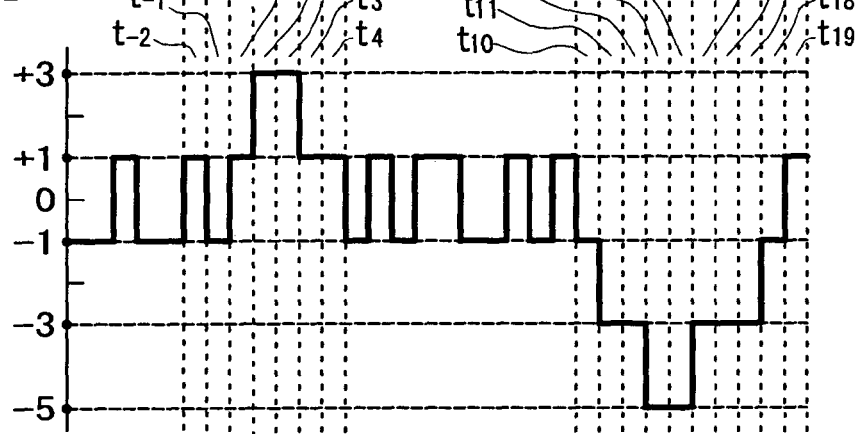
Figure 3C:
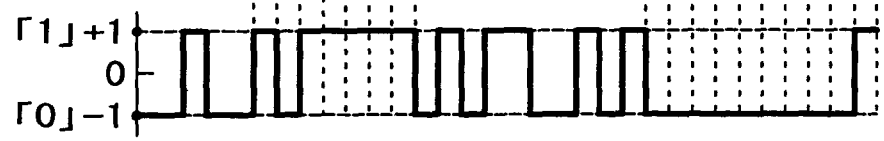

FIG. 3A, FIG. 3B, and FIG. 3C are diagrams of assistance in explaining a case where the first-order delta sigma modulator is used as delta sigma modulator in the succeeding stage. Description will first be made of a case where the two-bit quantizer 29 of the fifth-order delta sigma modulator in the preceding stage outputs quantized values in a range of +1 to −1. When the two-bit quantizer 29 outputs −1 as a quantized value in t−2 in FIG. 3A, the integrator 30 within the first-order delta sigma modulator 4 outputs −1 in a next sampling period t−1, and the one-bit quantizer 33 within the first-order delta sigma modulator 4 outputs −1 as it is within the same sampling period t−1. When the two-bit quantizer outputs +1 in the sampling period t−1 in FIG. 3A, the integrator 30 outputs the quantized value as +1 as it is in a sampling period t0 after a delay of one sampling period, and the one-bit quantizer 33 outputs the quantized value as +1 as it is within the same sampling period t0.

When the fifth-order delta sigma modulator 3 in the preceding stage for example outputs +3 in the sampling period t0 as shown in FIG. 3A and the output of the first-order delta sigma modulator 4 as the output of the one-bit quantizer 33 is +1 as shown in FIG. 3C, the integrator 30 of the first-order delta sigma modulator 4 in the succeeding stage stores the +3 in a next sampling period t1. In this case, +3 as a result of addition by the adder 31 of the output +1 of the shift computing element 32, the output +3 of the two-bit quantizer 29 of the fifth-order delta sigma modulator, and −1 obtained by inverting the output +1 obtained by quantizing the output of the shift computing element 32 by the one-bit quantizer 33 in the sampling period t0 is the output of the integrator 30. That is, a value calculated by (+1)+(+3)−(+1)=+3 is outputted from the integrator 30. As shown in FIG. 3C, the one-bit quantizer 33 outputs +1 as a maximum positive output value within the same sampling period t1.

Consequently, this is equivalent to a state in which +2 not outputted from the one-bit quantizer 33 remains in the integrator 30 in the sampling period t1.

When the two-bit quantizer 29 outputs +1 in the sampling period t1 in a state equivalent to that in which +2 remains in the integrator 30, the adder 31 is supplied in the sampling period t1 with +1 as the output of the two-bit quantizer 29, +3 as the output of the shift computing element 32, and an inverted value −1 of +1 as the output of the one-bit quantizer 33. The adder 31 outputs +3 to the shift computing element 32. The shift computing element 32 outputs the +3 in a next sampling period t2, as shown in FIG. 3B. Then, as shown in FIG. 3C, the one-bit quantizer 33 outputs +1 as the maximum positive value within the sampling period t2. Also at this time, not all the output of the shift computing element 32 is outputted from the one-bit quantizer 33. Consequently, this is equivalent to a state in which +2 remains in the integrator 30. That is, this is equivalent to a state in which +1 inputted from the two-bit quantizer 29 is integrated with +2 equivalently remaining in the integrator 30 in the sampling period t1 to become +3, and +1 of +3 is outputted from the one-bit quantizer 33 and +2 remains in the integrator. When the two-bit quantizer 29 outputs −1 in the next sampling period t2, the adder 31 is supplied with −1 outputted from the two-bit quantizer 29, the output +3 of the shift computing element 32 of the integrator 30, and an inverted value −1 of the output +1 of the one-bit quantizer 33. The adder 31 outputs +1. That is, −1 is inputted for a remaining value of +2, and +1 is outputted from the first-order delta sigma modulator 4, whereby the +2 is discharged in the sampling period t2. Then, +1 outputted from the two-bit quantizer 29 in a sampling period t3 is outputted as it is in a next sampling period t4.

Similarly, when −3 is inputted to the adder 31 in a sampling period t10 as shown in FIG. 3A, the integrator 30 outputs −3 in t11 after a delay of one sampling period. In a case where −3 is inputted to the input of the adder 31 again in a sampling period t12 before an amount of excess stored is discharged, the integrator 30 further accumulates an amount of excess, and outputs −5 in a sampling period t13. The accumulated amount of excess is discharged in units of −2 at the times of two inputs +1 appearing subsequently in sampling periods t14 and t17. At these times, the one-bit quantizer 33 outputs −1, an inverted value of the input +1. Then, +1 inputted to the adder in a sampling period t18 is outputted from the one-bit quantizer 33 as it is in a sampling period t19.

Thus, by using the first-order delta sigma modulator 4, it is possible to accumulate an amount of excess when a signal of ±3 is inputted, discharge the amount of excess when the discharge is possible by outputting a signal of an opposite sign from the input as the output of the one-bit quantizer 33, and thereby retain a total amount of energy possessed by signals, and also output an input signal of ±1 as it is only with a delay when there is no amount of excess.

The digital signal processing device 1 according to the first embodiment can thus represent even a high-level signal by one bit while maintaining an S/N ratio of the fifth-order delta sigma modulator 3 for a low-level audio band signal.

Figure 4:
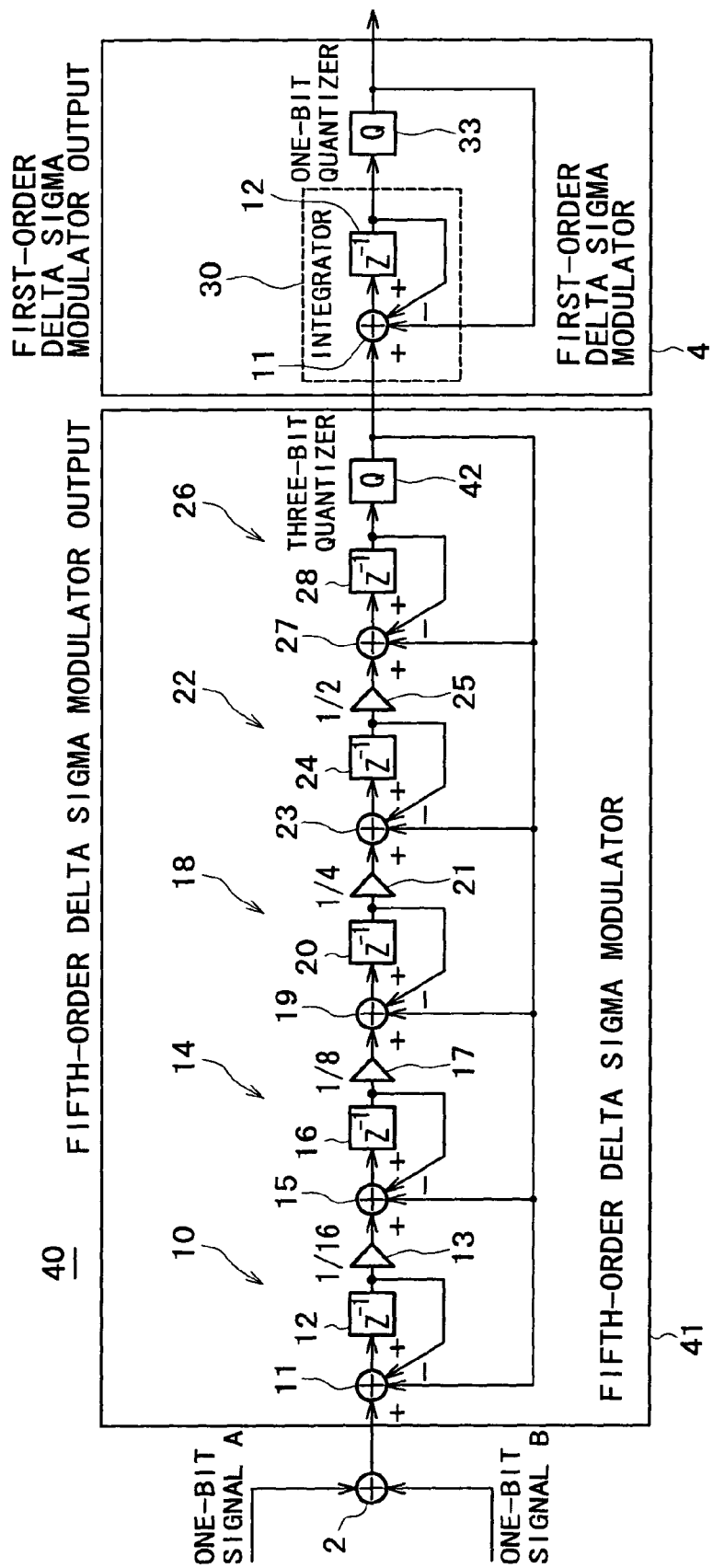
FIG. 4 is a diagram of configuration of a digital signal processing device according to a second embodiment.

A second embodiment will next be described with reference to FIG. 4. The second embodiment is also a digital signal processing device 40 for converting an output obtained by adding together a one-bit signal A and a one-bit signal B each obtained by delta sigma modulation processing into a one-bit signal using two cascaded delta sigma modulators, and deriving the output of the one-bit signal.

Specifically, in order to convert an input signal that may exceed the maximum audio band level representable by a one-bit signal into a one-bit signal, the digital signal processing device 40 comprises: a fifth-order delta sigma modulator 41 as first delta sigma modulating means including a three-bit quantizer 42 as first quantizing means for quantizing an input signal into eight values represented by three bits; and a first-order delta sigma modulator 4 as second delta sigma modulating means including a one-bit quantizer as second quantizing means for quantizing a three-bit delta sigma modulator output of the fifth-order delta sigma modulator 41 into a one-bit signal.

The fifth-order delta sigma modulator 41 differs from the fifth-order delta sigma modulator 3 within the digital signal processing device 1 according to the first embodiment only in that the fifth-order delta sigma modulator 41 has the three-bit quantizer 42. Therefore other parts are identified by the same reference numerals, and description thereof will be omitted.

The three-bit quantizer 42 quantizes an input signal into eight values of ±1, ±3, ±5, and ±7 as a first group of quantized values by three bits. The quantized values are two values ±1 having zero interposed between the two values and separated from the two values by equal quantities, and ±3, ±5, and ±7 separated at equal intervals from ±1 and having differences equal to 2 corresponding to a difference between the two values ±1 between the values ±3, ±5, and ±7 and their respective preceding values. These values are at equal intervals of the difference of 2. That is, the first group of quantized values are +7, +5, +3, +1, −1, −3, −5, and −7, at equal intervals of the difference of 2. The three-bit signal is negatively fed back as a feedback loop signal to each integrator. The three-bit quantizer 42 also outputs the output of the three-bit signal as a fifth-order delta sigma modulator output to the outside of the fifth-order delta sigma modulator 41.

The one-bit quantizer 33 within the first-order delta sigma modulator 4 uses values equal to the two least significant quantized values ±1 of the quantized values of the three-bit quantizer 42 as the first quantizing means as a second group of quantized values. The two one-bit values from the one-bit quantizer 33 are negatively fed back as a feedback loop signal to an integrator, and also outputted to the outside as a first-order delta sigma modulator output.

Principles of operation of the digital signal processing device 40 having the configuration shown above will be described in the following.

In order to enable modulation of a high-level signal also in the second embodiment, the number of quantization bits of the quantizer 42 is increased to three, and the fifth-order delta sigma modulator 41 using eight quantized values is used to generate a delta sigma modulated signal representing an audio band signal that temporarily exceeds ±1.

As described above, for the eight quantized values, zero is not used but quantized values ±1 at the time of one-bit quantization and ±3, ±5, and ±7 having the difference between the two values ±1 to be separated at equal intervals are used. A signal temporarily converted into a three-bit signal is reconverted into a one-bit signal by the first-order delta sigma modulator 4 in a subsequent stage.

In this case, the quantized values of the one-bit quantizer 33 in the subsequent stage are the same values as the least quantized values ±1 of the three-bit quantizer 42 in the preceding stage. Hence, while the audio band component is small and the quantized values in the preceding stage do not exceed the two values ±1, the output values in the preceding stage are outputted from the succeeding stage as they are only with a delay of one sample occurring in the first-order delta sigma modulator 4 in the subsequent stage. That is, characteristics of the fifth-order delta sigma modulation are outputted as they are. When the audio band component becomes large and the fifth-order delta sigma modulator 41 in the preceding stage outputs ±3, ±5, or ±7, on the other hand, the first-order delta sigma modulator 4 in the subsequent stage corrects an amount of excess after delaying the processing until a time when the amount can be corrected, and thereafter outputs values in the preceding stage as they are again. When +5 is outputted from the fifth-order delta sigma modulator 41 in the preceding stage, for example, the first-order delta sigma modulator 4 in the succeeding stage outputs +1, and stores a difference of 4 in the integrator 30. Then, when −1 comes next, the first-order delta sigma modulator 4 corrects −1 to +1, and outputs +1. Further, when another −1 comes, the first-order delta sigma modulator 4 corrects −1 to +1, and outputs +1. Thereby the difference of 4 stored in the integrator 30 is cleared. Thereafter the first-order delta sigma modulator 4 delays and outputs output of ±1 in the preceding stage as it is again. Thus, processing for conversion from three bits to one bit is performed only when amplitude of the audio band component becomes high and exceeds ±1, and the processing does not produce effects at other times.

While a delta sigma modulator normally modulates a signal within a range of quantized values, the quantizer 33 within the first-order delta sigma modulator 4 in the succeeding stage in this case functions to correct an amount of excess when a quantized value within the delta sigma modulator 41 exceeds ±1.

It is to be noted that the first quantizing means within the first delta sigma modulating means is not limited to the two-bit quantizer and the three-bit quantizer for quantizing an input signal into two bits and three bits, as described above. An integer n of 2 or more, such as 4, 5, 6 . . . , is applicable. It is conditioned that the quantized values are two values having zero interposed between the two values and separated from the two values by equal quantities, and values having a difference equal to a difference between the two values.

Also, while in both the first and second embodiments, the first delta sigma modulating means is a fifth-order delta sigma modulator, delta sigma modulating means of first, third, fourth, sixth, seventh, eighth . . . order, that is, delta sigma modulating means of plural order in which the above-mentioned number of integrator means are connected in series with each other may be used. However, the higher the order, the lower the percentage modulation.

Further, quantizing means within the delta sigma modulating means of plural order may of course be an n (2, 3, 4, 5, 6, . . . )-bit quantizer, as described above.

Further, while in both the first and second embodiments, the second delta sigma modulating means is a first-order delta sigma modulator, the second delta sigma modulating means may be a second-order delta sigma modulator. However, a delta sigma modulator of third order or higher is not suitable.

Description will be made in the following about difference in characteristics between a case where a first-order or second-order delta sigma modulator is employed as second delta sigma modulating means and a case where a third-order delta sigma modulator is employed as second delta sigma modulating means.

Description will first be made of a case where a first-order or second-order delta sigma modulator is employed as second delta sigma modulating means of the digital signal processing device 1 according to the first embodiment.

A signal temporarily converted into a two-bit signal by the fifth-order delta sigma modulator 3 as first delta sigma modulating means is reconverted into a one-bit signal by the first-order or second-order delta sigma modulator in the subsequent stage. In this case, the quantized values of the one-bit quantizer in the subsequent stage are the same values as the least quantized values ±1 of the two-bit quantizer in the preceding stage. Hence, while the audio band component is small and quantized values in the preceding stage do not exceed the two values ±1, the output values in the preceding stage are outputted from the succeeding stage as they are only with a delay of one sample occurring in the first-order delta sigma modulator in the succeeding stage or a delay of two samples occurring in the second-order delta sigma modulator in the succeeding stage. That is, characteristics of the fifth-order delta sigma modulation are outputted as they are.

Figure 5:
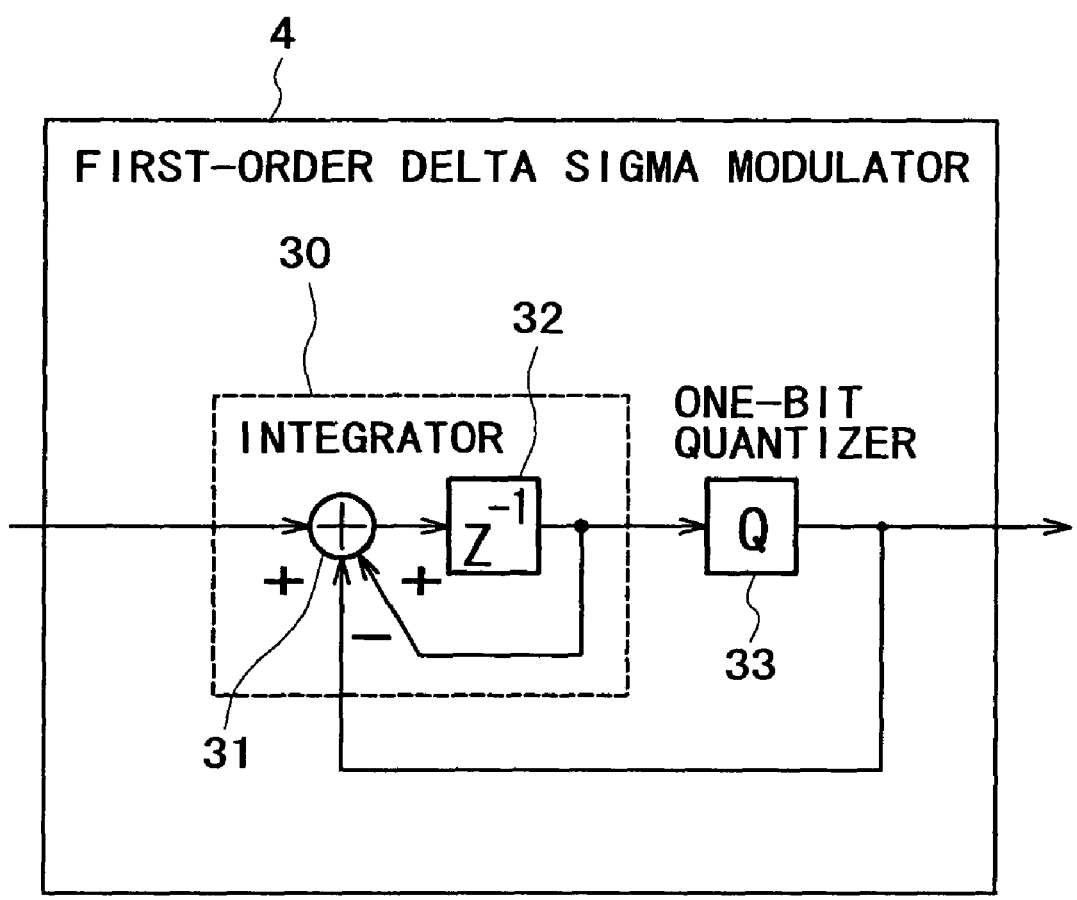
FIG. 5 is a diagram of configuration of a first-order delta sigma modulator.
Figure 6A:
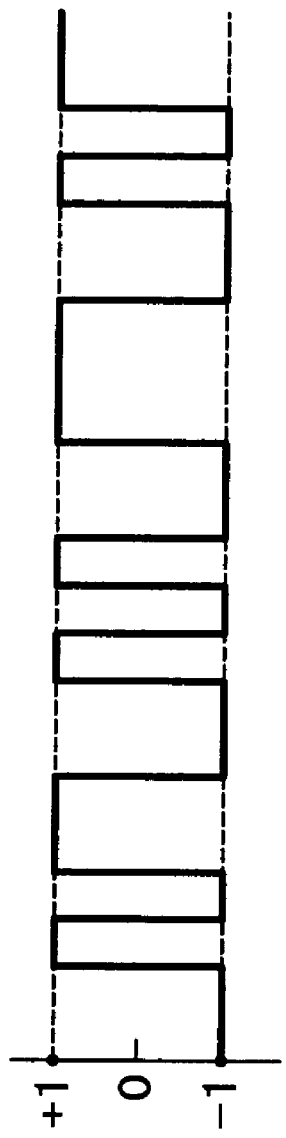
FIGS. 6A, 6B, and 6C are timing charts of assistance in explaining operation when the first-order delta sigma modulator is used.
Figure 6B:
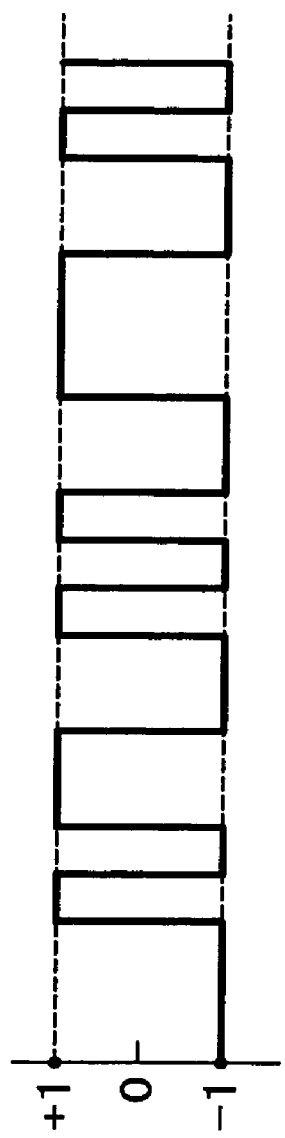
Figure 6C:
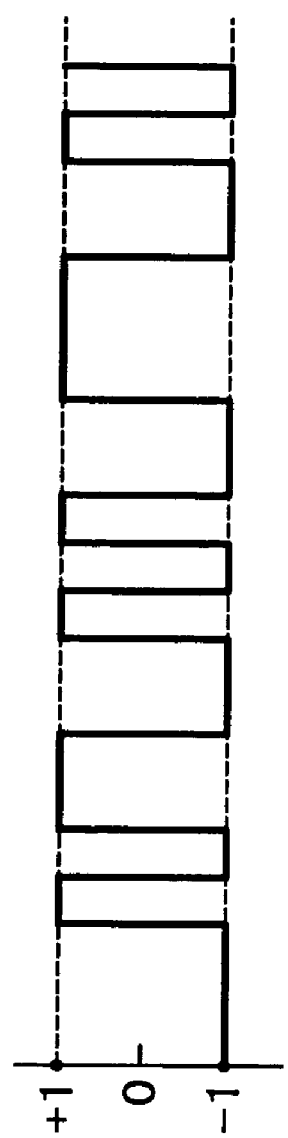

FIG. 5 shows the configuration of the first-order delta sigma modulator 4. FIG. 6A, FIG. 6B, and FIG. 6C are timing charts of assistance in explaining operation when the first-order delta sigma modulator 4 is used. Supposing that output of the integrator 30 obtained by subjecting a first-order delta sigma modulator input of FIG. 6A to integration processing is ±1 as shown in FIG. 6B, output of the one-bit quantizer 33 is the same signal as the output of ±1 of the integrator, as shown in FIG. 6C. Thus, since two feedback loop signals to the integrator 30 are same-level signals of opposite signs from the integrator 30 itself and the one-bit quantizer 33, a total value obtained by adding the two feedback loop signals together is zero at all times. Hence, the integrator 30 outputs an output signal of ±1 obtained by delaying an input signal by a period of one sample at all times, and the same signal of ±1 as the output signal of the integrator 30 is obtained as it is from the output of the one-bit quantizer.

Figure 7:
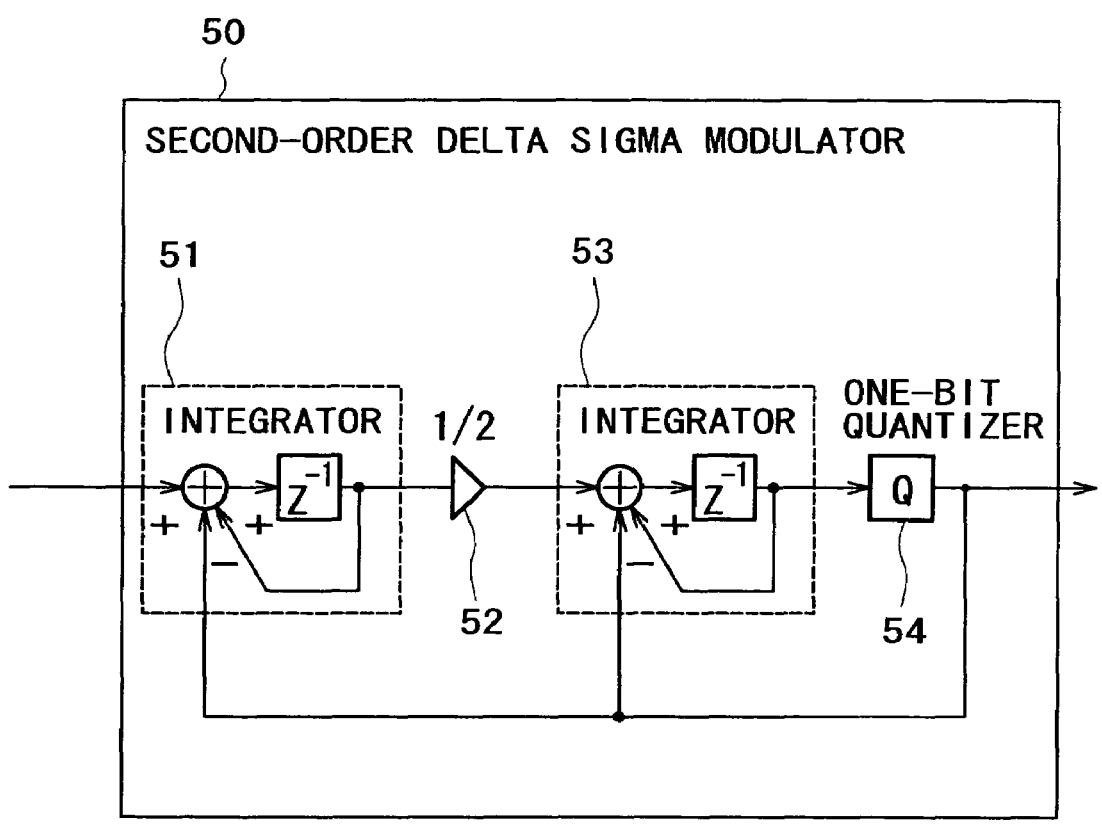
FIG. 7 is a diagram of configuration of a second-order delta sigma modulator.

FIG. 7 shows a configuration of a second-order delta sigma modulator 50. The second-order delta sigma modulator 50 is configured such that a first integrator 51 and a second integrator 53 are connected in series with each other with a coefficient multiplier 52 interposed therebetween, further a one-bit quantizer 54 is connected in a stage succeeding the second integrator, and a feedback loop signal is negatively fed back to the two integrators. The coefficient multiplier attenuates an integration output of the first integrator 51 by multiplying the output by a coefficient of ½.

FIG. 8A, FIG. 8B, FIG. 8C, and FIG. 8D are timing charts of assistance in explaining operation when the second-order delta sigma modulator 50 is used. Supposing that output of the first integrator 51 obtained by subjecting a second-order delta sigma modulator input of FIG. 8A to integration processing is ±2 as shown in FIG. 8B, integration output of the second integrator 53 is ±0.5, as shown in FIG. 8C. Then, quantized output of the one-bit quantizer 54 is as shown in FIG. 8D. That is, the output of the one-bit quantizer 54 as shown in FIG. 8D is of the same value as obtained by delaying the second-order delta sigma modulator input shown in FIG. 8A by a period of two samples.

Figure 9:
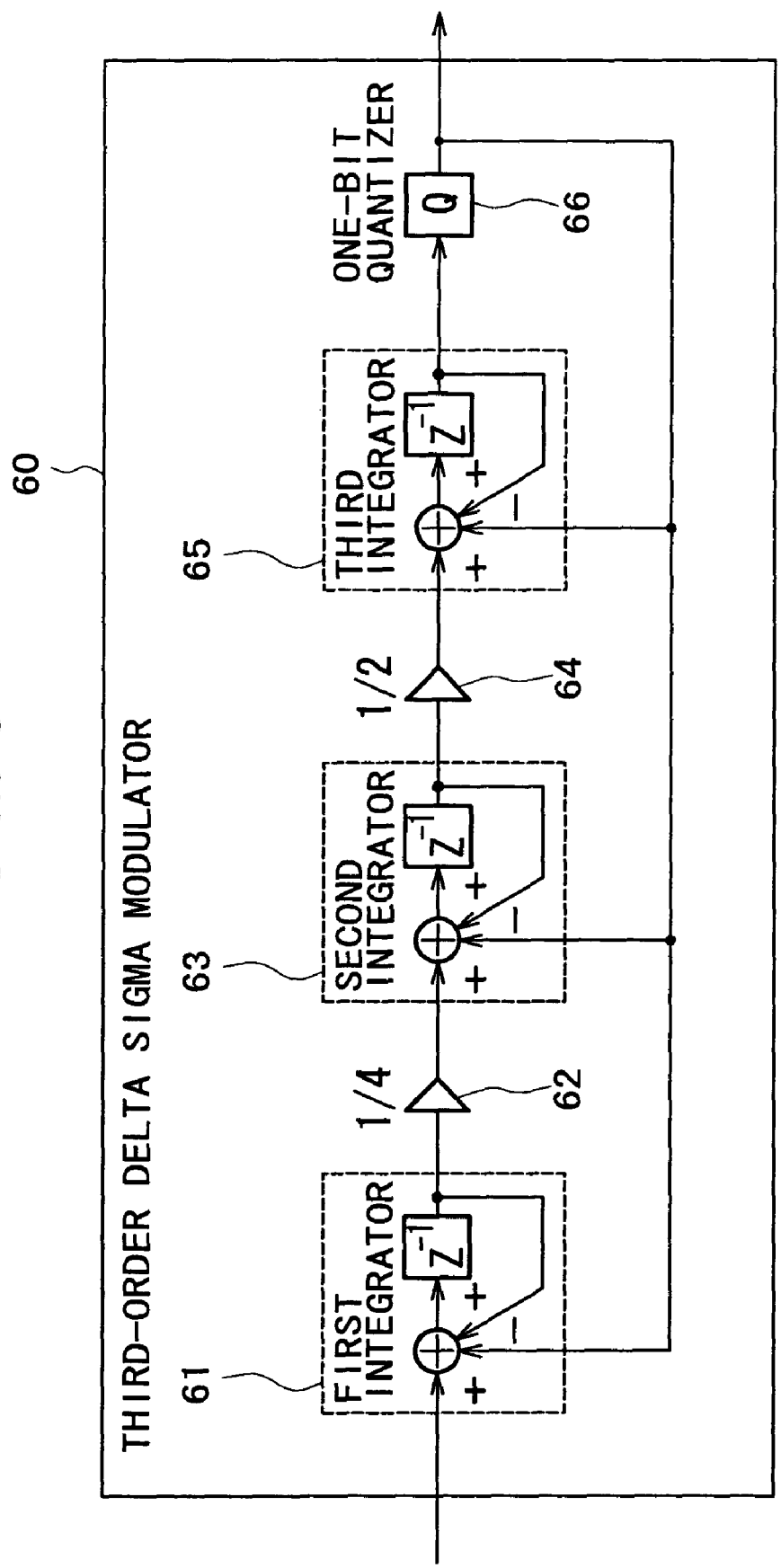
FIG. 9 is a diagram of configuration of a third-order delta sigma modulator.

Next, FIG. 9 shows a configuration of a third-order delta sigma modulator 60. The third-order delta sigma modulator 60 is configured such that a first integrator 61, a second integrator 63, and a third integrator 65 are connected in series with each other with a coefficient multiplier 62 and a coefficient multiplier 64 interposed therebetween, further a one-bit quantizer 66 is connected in a stage succeeding the third integrator, and a feedback loop signal is negatively fed back to the three integrators. The coefficient multiplier 62 attenuates an integration output of the first integrator 61 by multiplying the output by a coefficient of ¼, and then supplies the multiplied output to the second integrator 63. The coefficient multiplier 64 attenuates an integration output of the second integrator 63 by multiplying the output by a coefficient of ½, and then supplies the multiplied output to the third integrator 65.

Figure 10A:
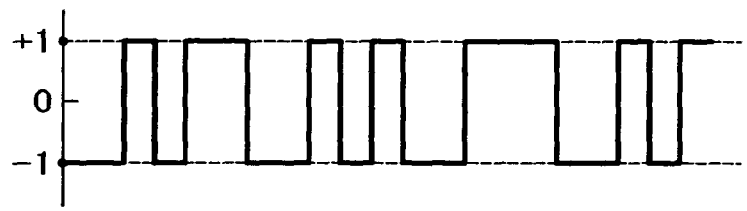
FIGS. 10A, 10B, 10C, 10D, and 10E are timing charts of assistance in explaining operation when the third-order delta sigma modulator is used.
Figure 10B:
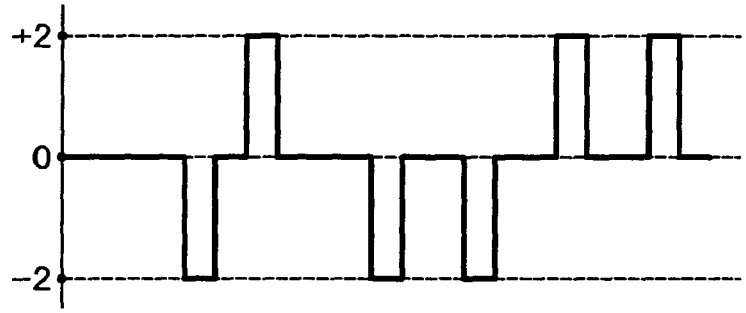
Figure 10C:
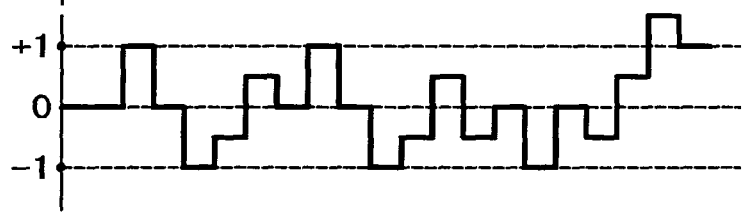
Figure 10D:
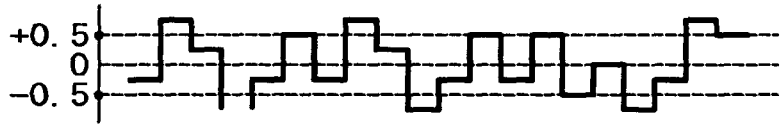
Figure 10E:
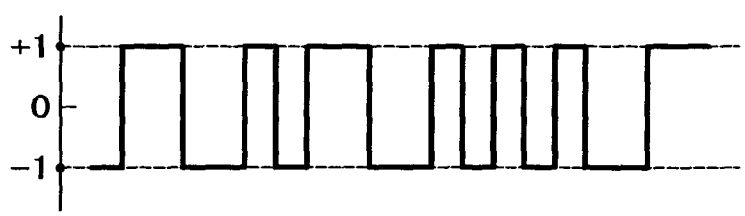

FIG. 10A, FIG. 10B, FIG. 10C, FIG. 10D, and FIG. 10E are timing charts of assistance in explaining operation when the third-order delta sigma modulator 60 is used. Supposing that the output of the first integrator 61 obtained by subjecting a third-order delta sigma modulator input of FIG. 10A to integration processing is ±2 as shown in FIG. 10B, the integration output of the second integrator 63 is ±1, as shown in FIG. 10C. Further, integration output of the third integrator 65 is as shown in FIG. 10D. Then, quantized output of the one-bit quantizer 66 is as shown in FIG. 10E. That is, the output of the one-bit quantizer 66 as shown in FIG. 10E is not of the value obtained by simply delaying the third-order delta sigma modulator input shown in FIG. 10A, and is thus a signal different from the third-order delta sigma modulator input.

Thus, the third-order delta sigma modulator is not suitable as delta sigma modulator to be used as the second delta sigma modulating means, but delta sigma modulators of second order or lower are suitable as delta sigma modulator to be used as the second delta sigma modulating means.

It is to be noted that while in the first and second embodiments, a case where one-bit signals from two systems are added together (mixed) is shown as an example of increase in level of an audio band component, various other cases in which level of an original one-bit signal is exceeded are conceivable, such as cases of mixing of multiple channels such as 3, 4, 5, or 6 channels, level control in fade-in, fade-out, cross-fade and the like.

The digital signal processing device and method according to the present invention subject a signal of a length of a plurality of bits modulated by first delta sigma modulating means having a quantizer of a plurality of m bits to delta sigma modulation again by second delta sigma modulating means of low order n (2 or lower). It is thereby possible to obtain a one-bit signal representing even a high-level signal by subjecting only an amount of excess level to remodulation only when signal level is increased, while realizing a high S/N ratio of a high-order delta sigma modulator for a low-level signal. That is, it is possible to obtain a one-bit signal representing even a high-level signal while realizing a low quantization noise level by high-order delta sigma modulation for a signal having a low audio band signal level.

Further, the digital signal processing device and method according to the present invention has second quantizing means for outputting values equal to two least significant quantized values of a first group of quantized values outputted by a first quantizing means and step as a second group of quantized values, wherein the second quantizing means averages energy of the first group of quantized values outputted by the first quantizing means and outputs the second group of quantized values. It is therefore possible to requantize multi-bit data into one-bit data with a simple configuration.

While a preferred embodiment has been described, variations thereto will occur to those skilled in the art within the scope of the present inventive concepts which are delineated by the following claims

What is claimed is:

1. A digital signal processing device to which, after digital signals are subjected to predetermined processing, a processed digital signal having signal amplitude values exceeding signal amplitude values of said digital signals is inputted, said digital signal processing device comprising:

first delta sigma modulating means including first quantizing means having quantized amplitude values for allowing at least quantization of signal amplitude of said inputted processed digital signal; and second delta sigma modulating means including second quantizing means having quantized amplitude values equal to the signal amplitude values of said digital signals for quantizing a modulated signal output from said first delta sigma modulating means, wherein said first quantizing means of said first delta sigma modulating means is operable to perform quantization with quantized values, each comprising n bits (n is 2 or more), and to use two values having a zero interposed between the two values and separated from the two values by equal quantities and values having a difference equal to a difference between the two values as the quantized values, and wherein said second quantizing means of said second delta sigma modulating means is operable to use values equal to two least significant quantized values of the quantized values of said first quantizing means as quantized values.

2. The digital signal processing device as claimed in claim 1, wherein said second delta sigma modulating means includes delaying means for delaying a part of a quantized signal output from said first quantizing means and outputting the delayed part to said second quantizing means when quantized data output from said first quantizing means has an amplitude value exceeding the quantized amplitude values of said second quantizing means.

3. The digital signal processing device as claimed in claim 1, wherein said second quantizing means of said second delta sigma modulating means averages energy by converting a delta sigma modulated output of said first delta sigma modulating means to one bit.

4. A digital signal processing method in which digital signals are subjected to predetermined processing, and a processed digital signal having signal amplitude values exceeding signal amplitude values of said digital signals is inputted, said digital signal processing method comprising:
    a step of subjecting said inputted processed digital signal to delta sigma modulation to produce a delta sigma modulated signal and quantizing an amplitude of said delta sigma modulated signal with at least quantized values not less than the signal amplitude values of said processed digital signal to produce a quantized modulated signal; and
    a step of quantizing said quantized modulated signal into quantized amplitude values equal to the signal amplitude values of said digital signals,
    wherein the delta sigma modulated signal obtained by subjecting said inputted processed digital signal to delta sigma modulation is quantized by n bits (n is 2 or more), and two values having a zero interposed between the two values and separated from the two values by equal quantities and values having a difference equal to a difference between the two values are used as quantized values, and
    wherein the step of quantizing said quantized modulated signal into the quantized amplitude values equal to the signal amplitude values of said digital signals uses values equal to two least significant quantized values of the quantized values for quantizing said quantized modulated signal into the quantized amplitude values equal to the signal amplitude values of said digital signals as quantized values.

5. The digital signal processing method as claimed in claim 4,
    further comprising when quantizing said quantized modulated signal into the quantized amplitude values equal to the signal amplitude values of said digital signals, a step of delaying processing for quantizing a part where a quantized value of said quantized modulated signal exceeds the signal amplitude values of said digital signals.

6. A digital signal processing device to which, after digital signals represented by one bit are subjected to predetermined signal processing, a processed digital signal having signal level exceeding said one bit is inputted, said digital signal processing device comprising:
    first quantizing means for outputting two values having zero interposed between the two values and each of the two values being separated from zero by equal quantities and for outputting other values in which a difference between adjacent ones of the other values and the two values is equal to a difference between the two values as a first group of quantized values, each comprising n bits (n is 2 or more); and
    second quantizing means for outputting values equal to two least significant quantized values of the first group of quantized values output by said first quantizing means as a second group of quantized values,
    wherein said second quantizing means averages energy of said first group of quantized values output by said first quantizing means and outputs said second group of quantized values.

7. The digital signal processing device as claimed in claim 6, further comprising integrating means disposed between said first quantizing means and said second quantizing means for integrating said first group of quantized values and supplying an integration result to said second quantizing means,
    wherein said integrating means accumulates an amount of excess of said first group of quantized values outputted by said first quantizing means over said second group of quantized values, adds an opposite sign in timing in which the amount of excess is dischargeable, and supplies the amount of excess to said second quantizing means.

8. The digital signal processing device as claimed in claim 7,
    wherein second quantizing means outputs said second group of quantized values in such a manner as to retain a total amount of energy of said first group of quantized values.

9. The digital signal processing device as claimed in claim 7,
    wherein said second quantizing means outputs two least significant values of said first group of quantized values as they are after said amount of excess is cleared from said integrating means.

* * * * *